(12) United States Patent
Wang (10) Patent No.: US 8,947,770 B2
(45) Date of Patent: Feb. 3, 2015

(54) SYSTEMS AND METHODS FOR MEASURING POWER LEVELS IN AN OPTICAL DEVICE

(75) Inventor: Hongsheng Wang, Bound Brook, NJ (US)

(73) Assignee: Aeon Corporation, Princeton Junction, NJ (US)

( * ) Notice: Subject to any disclaimer, the term of this patent is extended or adjusted under 35 U.S.C. 154(b) by 637 days.

(21) Appl. No.: 13/209,752

(22) Filed: Aug. 15, 2011

(65) Prior Publication Data

US 2012/0038974 A1 Feb. 16, 2012

Related U.S. Application Data

(60) Provisional application No. 61/373,297, filed on Aug. 13, 2010.

(51) Int. Cl.
| | |
|---|---|
| *H01S 5/02* | (2006.01) |
| *H04B 10/079* | (2013.01) |
| *G01J 1/42* | (2006.01) |
| *G01J 1/02* | (2006.01) |
| *H01S 5/50* | (2006.01) |
| *H01S 5/022* | (2006.01) |
| *H01S 5/0683* | (2006.01) |

(52) U.S. Cl.
CPC ......... *H04B 10/07955* (2013.01); *G01J 1/4204* (2013.01); *G01J 1/4228* (2013.01); *G01J 1/0295* (2013.01); *H01S 5/50* (2013.01); *H01S 2301/18* (2013.01); *G01J 1/4257* (2013.01); *H01S 5/02284* (2013.01); *H01S 5/0683* (2013.01); *H01S 2301/02* (2013.01)

USPC ............................ 359/344; 398/38; 250/214.1

(58) Field of Classification Search
USPC .......................................... 398/38; 250/214.1
See application file for complete search history.

(56) References Cited

U.S. PATENT DOCUMENTS

| | | | | |
|---|---|---|---|---|
| 6,025,918 | A * | 2/2000 | Maris ............................ | 356/388 |
| 2011/0051143 | A1 * | 3/2011 | Flanders et al. .............. | 356/451 |
| 2013/0135749 | A1 * | 5/2013 | Akutsu et al. ................. | 359/633 |

OTHER PUBLICATIONS

Caltech. Ph 77 Advanced Physics Laboratory—Atomic and Optical Physics—Expt. 71—Fabry-Perot Cavities and FM Spectroscopy. Downlaoded on Mar. 16, 2014, uploaded on Dec. 10, 2008. http://web.archive.org/web/20081210000129/http://www.its.caltech.edu/~ph76a/cavities.pdf.*

* cited by examiner

*Primary Examiner* — Ari M Diacou
(74) *Attorney, Agent, or Firm* — Kaplan Breyer Schwarz & Ottesen, LLP (57) ABSTRACT

An apparatus for monitoring optical equipment in an optical circuit is disclosed in which the apparatus may include an optical device situated to receive an optical input signal and to reflect a portion of the energy of the received optical input signal, thereby providing a reflected input signal; a first photodiode located along a path of the reflected input signal, and operable to receive optical energy from the reflected optical input signal and from ambient optical power; a second photodiode located substantially outside the reflection path of the optical input signal; and means for calculating a magnitude of a power level of the optical input signal from values of outputs from the first and second photodiodes.

20 Claims, 5 Drawing Sheets

SYSTEMS AND METHODS FOR MEASURING POWER LEVELS IN AN OPTICAL DEVICE

CROSS-REFERENCE TO RELATED APPLICATIONS

This application claims the benefit of U.S. Provisional Patent Application Ser. No. 61/373,297, filed Aug. 13, 2010, entitled "Optical Receiver With Dual Monitors" the disclosure of which is hereby incorporated by reference herein in its entirety.

BACKGROUND OF THE INVENTION

In the field of optical circuitry, it is commonly desirable to measure power levels in a circuit as a whole and/or in one or more devices within the circuit. Existing techniques commonly use power splitters which split off a portion of the input power along a path to be employed for power measurement purposes. While power splitting may provide a reasonable estimate of power levels, reserving a portion of the input power for measurement purposes requires a sacrifice of input power that could otherwise be used for the operation of the optical circuit, which is undesirable. Accordingly, there is a need in the art for improved systems and methods for measuring the optical power levels in optical devices.

SUMMARY OF THE INVENTION

According to one aspect, the present invention is directed to an apparatus for monitoring optical equipment in an optical circuit, that may include an optical device situated to receive an optical input signal and to reflect a portion of the energy of the received optical input signal, thereby providing a reflected input signal; a first photodiode located along a path of the reflected input signal, and operable to receive optical energy from the reflected optical input signal and from ambient optical power; a second photodiode located substantially outside the reflection path of the optical input signal; and means for calculating a magnitude of a power level of the optical input signal from values of outputs from the first and second photodiodes.

Other aspects, features, advantages, etc. will become apparent to one skilled in the art when the description of the preferred embodiments of the invention herein is taken in conjunction with the accompanying drawings.

BRIEF DESCRIPTION OF THE DRAWINGS

For the purposes of illustrating the various aspects of the invention, there are shown in the drawings forms that are presently preferred, it being understood, however, that the invention is not limited to the precise arrangements and instrumentalities shown.

DETAILED DESCRIPTION OF THE PREFERRED EMBODIMENTS

In the following description, for purposes of explanation, specific numbers, materials and configurations are set forth in order to provide a thorough understanding of the invention. It will be apparent, however, to one having ordinary skill in the art that the invention may be practiced without these specific details. In some instances, well-known features may be omitted or simplified so as not to obscure the present invention. Furthermore, reference in the specification to phrases such as "one embodiment" or "an embodiment" means that a particular feature, structure or characteristic described in connection with the embodiment is included in at least one embodiment of the invention. The appearances of phrases such as "in one embodiment" or "in an embodiment" in various places in the specification do not necessarily all refer to the same embodiment.

The following discussion is directed to a system and method for measuring power levels in devices in an optical circuit, in a manner that preferably does not expend any power in addition to that supplied for the operation of the optical circuit itself. More specifically, in an embodiment, the systems and methods disclosed herein are operable to use reflected signal energy to measure the power levels in a device. Since reflected input signal energy would generally be emitted by the device with or without a measurement system in place, the measurement process preferably does not expend any energy that wasn't already being expended. The systems and methods for accomplishing the power measurement are discussed in greater detail below in connection with the accompanying figures.

In one embodiment, the technology herein may be directed to providing an in-package, non-power-tap monitoring solution for an SOA. Preferably, the directivity of power monitoring solution is above 30 decibels (dB).

Figure 1:
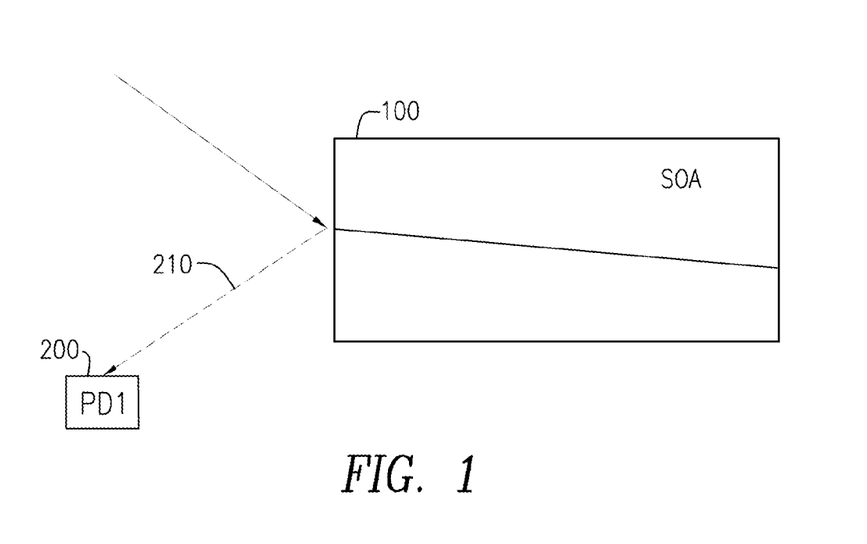
FIG. 1 is a schematic diagram of a portion of an optical circuit including a semiconductor optical amplifier (SOA) and a photodiode.

FIG. 1 is a schematic diagram of a portion of an optical circuit including a semiconductor optical amplifier (SOA) 100 and a photodiode 200. In the layout of FIG. 1, photodiode 1 (PD1) 200 may receive energy both from the reflected input signal 210 as well as ASE energy from SOA 100. Using the arrangement shown in FIG. 1, PD1 200 may be unable to determine what proportion of light energy comes from reflected input signal 210 and what proportion comes from ASE energy. More generally, in the embodiment of FIG. 1 it may be difficult to distinguish between the reflected signal 210 energy of interest and all other optical energy, including ambient optical energy.

Figure 2:
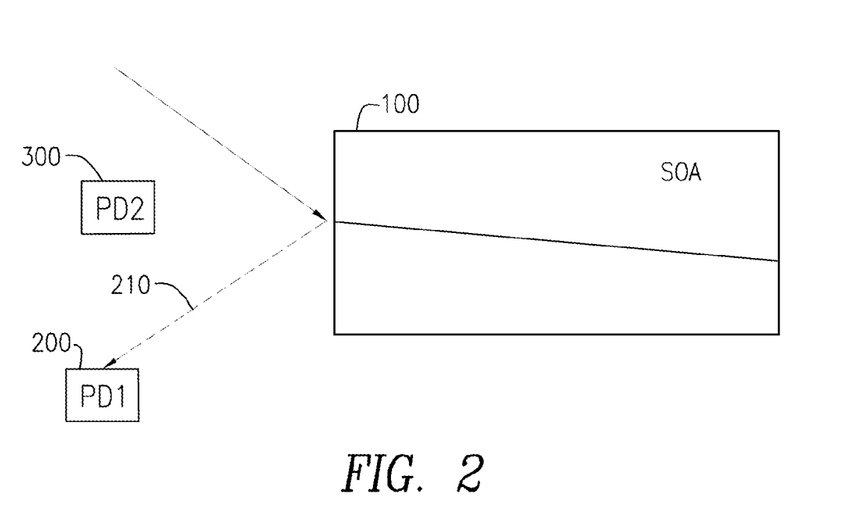
FIG. 2 is a schematic diagram of a portion of an optical circuit including a semiconductor optical amplifier (SOA) and two photodiodes in accordance with an embodiment of the present invention.

FIG. 2 is a schematic diagram of a portion of an optical circuit including an SOA and two photodiodes 200, 300 in accordance with an embodiment of the present invention.

In an embodiment, a plurality of photodiodes (PDs) placed at a plurality of different respective locations in the vicinity of SOA 100 may be employed to measure light received at the respective photodiode locations. The plurality of PDs may be located and calibrated so as to enable the combination of PDs to receive different amounts of light arising from (a) reflected signal energy; and (b) ASE energy. Assuming that the various PDs still each receive a combination of reflected signal energy and ASE energy, suitable mathematical processing may be employed to resolve the components of reflected signal energy and ASE energy in the measurements of the respective PDs. Computer processing apparatus including one or more processors, one or more random-access memory devices, one or more non-volatile data storage devices (such as but not limited to hard drives), and one or more math co-processors could be employed to perform the relevant calculations. The calculations could be performed in real time as the light measurement is data is obtained. Alternatively, the light measurement data could be sampled and data representing the respective light measurements could be stored and used for calculation some period of time after the data has been acquired. Suitable analog-to-digital conversion equipment could be deployed to convert electrical output energy from the photodiodes into digital data suitable for processing by a computer, such as, but not limited to, computer system 600 described herein in connection with FIG. 5.

FIG. 2 shows a simplified version of an embodiment according to the present invention. FIG. 2 is discussed below, and is followed by a more detailed discussion of an embodiment suitable for implementing the power measurement scheme disclosed herein.

The arrangement of FIG. 2 shows an SOA 100, PD1 200 which may be located along the path of reflected input signal 210, and a second photodiode PD2 300 located away from the path of reflected input signal 210. PD1 200 and PD2 300 may have different responsivities to ASE energy and reflected input signal energy. Herein, the term responsivity refers to a change in electrical output of a photodiode in response to a change in optical power detected at the photodiode. The value of the responsivity of a particular photodiode to a change in a particular type of optical power detected thereat may be referred to herein as a responsivity coefficient.

In an embodiment, the responsivity of each of PD1 200 and PD2 300 to both reflected input signal energy and ASE energy may be calibrated separately. Calibrating the PDs separately preferably enhances the ability to later mathematically resolve the raw energy measurements directly from PD1 200 and PD2 300 into the components of ASE energy and reflected input signal energy of interest to the monitoring process. Once the photodiodes have been calibrated, and the raw energy measurements obtained from the two photodiodes 200, 300, calculations may be performed to isolate the quantities of interest, specifically the ASE energy and the reflected input signal energy.

The concept of using multiple photodiodes in different locations, and having different responsivity levels for optical power from different sources was described above using two photodiodes. However, it will be appreciated that in other embodiments of the present invention, three or more photodiodes could be employed to resolve the values of reflected energy and ASE energy, among other possible sources of light that may be detected at photodiodes in an optical circuit.

Figure 3:
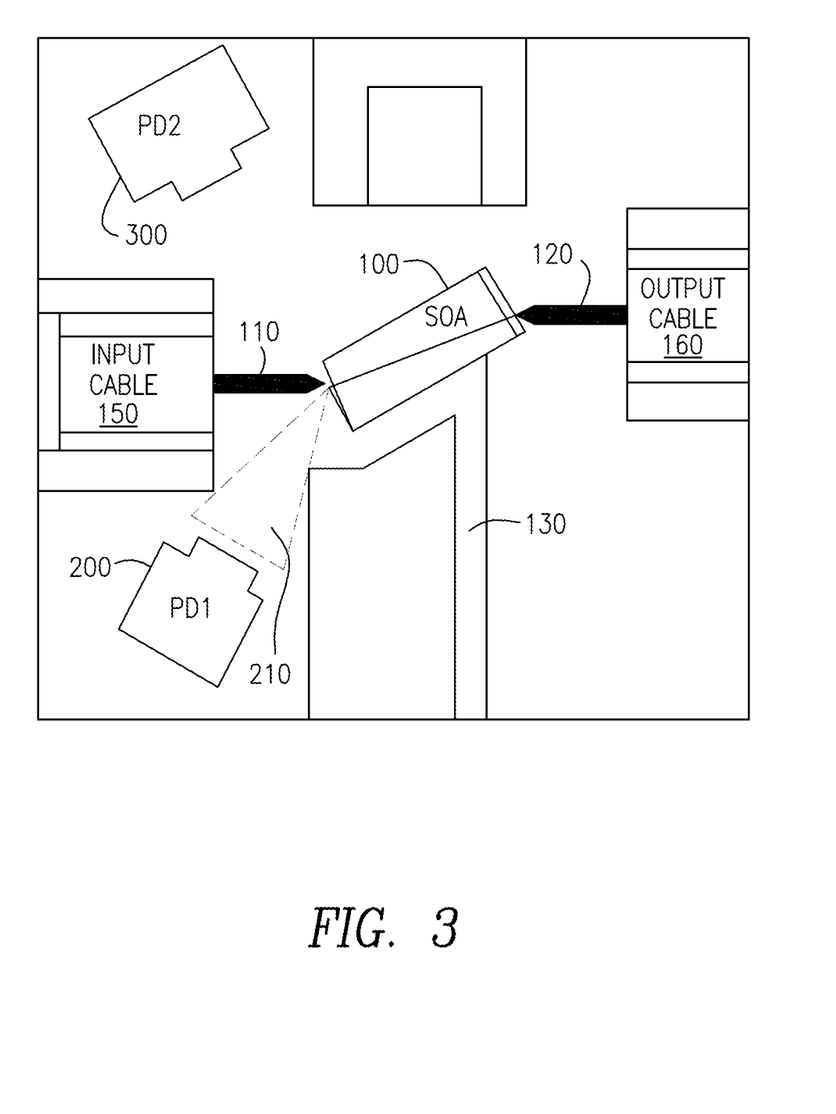
FIG. 3 is a schematic diagram of a portion of an optical circuit including a semiconductor optical amplifier (SOA) and two photodiodes in accordance with an embodiment of the present invention.

FIG. 3 is a schematic diagram of a portion of an optical circuit including an SOA 100 and two photodiodes 200, 300 in accordance with an embodiment of the present invention.

The optical circuit portion shown in FIG. 3 may include SOA 100, input cable 150 having input fiber 110, output cable 160 having output fiber 120, PD1 200 on the path of reflected input signal 210 (also referred to herein as reflected input signal beam 200), PD2 300, and/or carrier 130.

In this embodiment, PD1 200 and PD2 300 may both receive optical energy from both (a) amplified spontaneous emission (ASE) from the SOA 100 and (b) from a reflection of the input signal, referred to herein as reflected input signal 210. ASE optical energy may emerge from part or all of the active region of the SOA, while reflected input signal 210 is much more concentrated, as illustrated schematically in FIG. 3 by a cone-shaped region emerging from SOA 100.

In this embodiment, locating PD1 200 in the path of the reflected input signal beam 210, and locating PD2 300 substantially distant from the path of reflected input signal 210, may result in the ASE energy and energy from reflected input signal 210 to contribute different proportions of the power levels received and detected at PD1 200 and PD2 300. For example, as a general matter, we would expect reflected input signal 210 to represent a higher proportion of the optical power detected at PD1 200 than at PD2 300.

In this embodiment, upon using the equations shown below, we may calculate the amounts of energy contributed by ASE energy and reflected input signal 210 energy with both the ASE and input signal with high precision.

The photocurrent values $I_1$ and $I_2$, for $PD_1$ 200 and $PD_2$ 300, respectively, may be expressed as shown in Equation (1) below.

$$\begin{bmatrix} I_1 \\ I_2 \end{bmatrix} = \begin{bmatrix} \eta_{11} & \eta_{12} \\ \eta_{21} & \eta_{22} \end{bmatrix} \begin{bmatrix} P_{ASE} \\ P_{in} \end{bmatrix}. \qquad \text{Eq (1)}$$

In equation (1), $I_1$ and $I_2$ are the electrical current outputs generated from PD1 200 and PD2 300, respectively. $P_{ASE}$ and $P_{in}$ are the ASE power and input signal 210 power, respectively. $\eta_{11}, \eta_{12}$, etc (in the first of the two matrixes above) are the responsivity coefficients of the photodiodes to ASE power and reflected signal 210 optical power. Otherwise stated, $\eta_{11}$, $\eta_{12}$, etc are coefficients relating the output current of each photodiode as a function of variation of two different sources of input optical power. Thus, in this embodiment, $\eta_{22}$ preferably relates the ASE power level at PD1 to a first component of the current output of PD1. Continuing with the coefficients, $\eta_{12}$ preferably relates the power level of the reflected input signal 210 power to a second component of current output from PD1. The coefficient $\eta_{21}$ relates a first component of the current output from PD2 to the ASE power level received at PD2; and the coefficient in preferably relates the power of reflected input signal 210 detected at PD2 to a second component of the electrical current output from PD2.

In this embodiment, a first step may include determining the responsivity coefficients of the PDs 200, 300 using a calibration process. To increase accuracy and reduce measurement error due to noise in the electronics, for the photodiodes 200 and 300, a series of current measurements at the PDs 200, 300 may be taken with varying input power. The responsivities may then be calculated using a least-square-fit method.

While the optical device monitoring system discussed herein contemplates conversion of optical power into electrical current, the present invention is not limited to this approach. Alternatively, optical power could be converted into any quantity useful for subsequent processing of data indicative of the optical power present at the respective photodiodes 200, 300. Such alternative quantities may include, but are not limited to, voltage, temperature, heat flow, and mechanical displacement (either linear or angular).

In one embodiment, each of the responsivity coefficients may be determined by conducting a series of measurements of current output from each of the photodiodes 200, 300 while varying the value of either the ASE power or the input signal power, while keeping the level of the other source of optical power constant. Thus, to obtain data for $\eta_{11}$ (which is indicative the variation in current output at PD1 with variation in ASE power), the input signal is preferably turned off. Thereafter, measurements of the output current at PD1 may be taken for various levels of ASE power. The responsivity coefficient value—$\eta_{11}$—may then be determined by applying a least-square-fit calculation to the gathered current-power data.

Similarly, to obtain data for $\eta_{12}$ (which is indicative the variation in current output at PD1 200 with variation in reflected input signal power), measurements of the output current from PD1 200 for various different values of the input signal power may be taken, while keeping the ASE power, and other sources of ambient optical power, constant. The responsivity coefficient value—$\eta_{12}$—may then be determined by applying a least-square-fit calculation to the gathered data correlating PD1 200 output current to reflected input signal 210 power. The above steps may be repeated to obtain the responsivity coefficients for PD2 300.

Once the respective photodiodes have been calibrated, the combination of photodiodes PD1 200, PD2 300, and/or any further photodiodes are preferably able to receive light from both the reflected signal 210 and ASE energy sources. Preferably, a system disclosed herein is operable to receive light containing a mixture of energy from ASE sources and from reflected signal 210 at two or more photodiodes and to resolve the multiple-source light energy into component parts, namely (a) ASE energy and (b) reflected signal 210 energy. Both of the resolved energy components are useful for the purpose of ongoing monitoring of the operation of the SOA 100 or any other selected optical device.

In this embodiment, any combination of ASE power and reflected input signal 210 power can be calculated by multiplying two matrices together, as shown in Equation (2) below. Specifically, the inverse of the responsivity matrix may be multiplied by a "photocurrent vector" which vector may be a two-row by one-column matrix indicative of photocurrents $I_1$ and $I_2$ generated by optical power at $PD_1$ 200 and $PD_2$ 300, respectively. Multiplying the matrices together as described above provides:

$$\begin{bmatrix} P_{ASE} \\ P_{in} \end{bmatrix} = \begin{bmatrix} \eta_{11} & \eta_{12} \\ \eta_{21} & \eta_{22} \end{bmatrix}^{-1} \begin{bmatrix} I_1 \\ I_2 \end{bmatrix}. \quad \text{Eq (2)}$$

Figure 5:
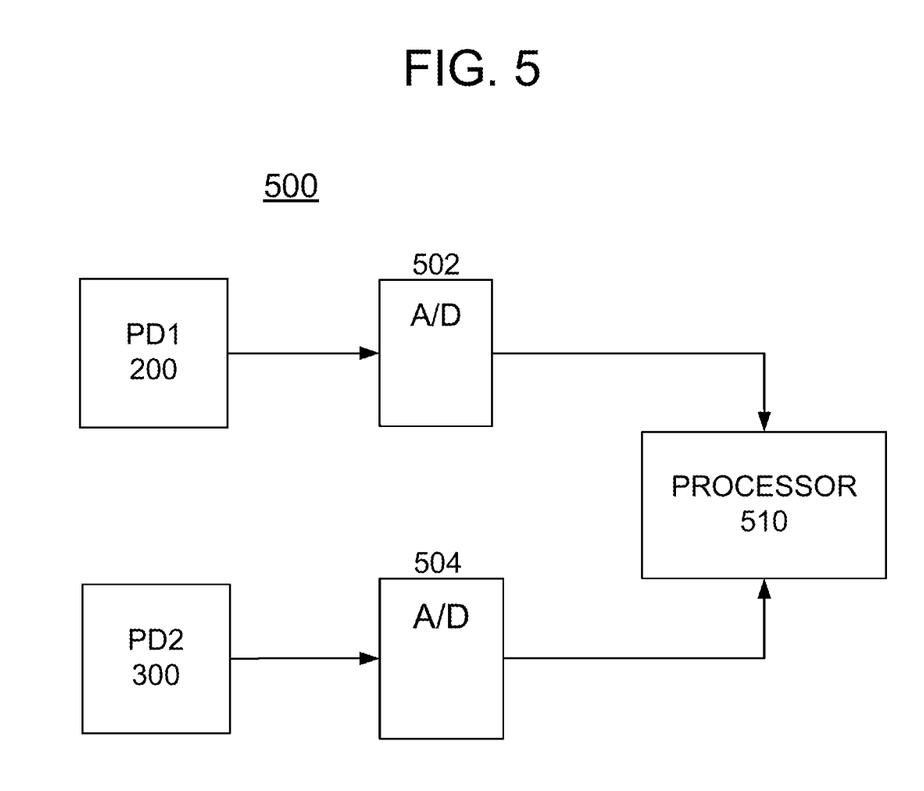
FIG. 5 is a block diagram of the interface of an optical circuit to a processor in accordance with an embodiment of the present invention.

The calculation of equation (2) may be implemented using analog-to-digital conversion hardware and a general purpose computer system, such as, but not limited to, system 600 shown in FIG. 5. Alternatively, other computational equipment, such as Application Specific Integrated Circuits (ASICs) may be employed in place of a general purpose computer.

Thus, according to one embodiment, the present invention is directed to a method of measuring Amplified Spontaneous Emission (ASE) optical power and reflected input signal power in an optical device, which method may include positioning first and second photodiodes 200, 300 so as to receive optical energy, calculating the contribution of each of the input signal and the ASE to the energy received at the first and second photodiodes, and then calculating a first value corresponding to reflected input signal power level and a second value corresponding to an ASE power level.

Table I below shows an exemplary relationship between input power to SOA 100 and the magnitudes of $I_1$ and $I_2$ that result therefrom. A list of six operating conditions for the optical circuit under which the data of Table I were collected appear immediately below Table I.

TABLE I

| Input Power (uW/dBm) | $I_1$ (uA) | $I_2$ (uA) |
|---|---|---|
| 923/−0.35 | 24.3 | 2.13 |
| 292/−5.35 | 9.52 | 1.98 |
| 92.3/−10.35 | 4.78 | 1.93 |
| 29.2/−15.35 | 3.28 | 1.92 |
| 9.23/−20.35 | 2.81 | 1.91 |

OPERATING CONDITIONS FOR DATA PRESENTED IN TABLE I:
$I_{SOA}$ = 120 mA
$P_{ASE}$ = 49 uW
PD (photodiode) diameter: 300 um
Input size of SOA is uncoated
No bias voltage applied to PD
PD dark current 3 nA FIG. 4 is a graph of the sum of $I_1$ and $I_2$ versus input power, as shown in Table I above.

Figure 4:
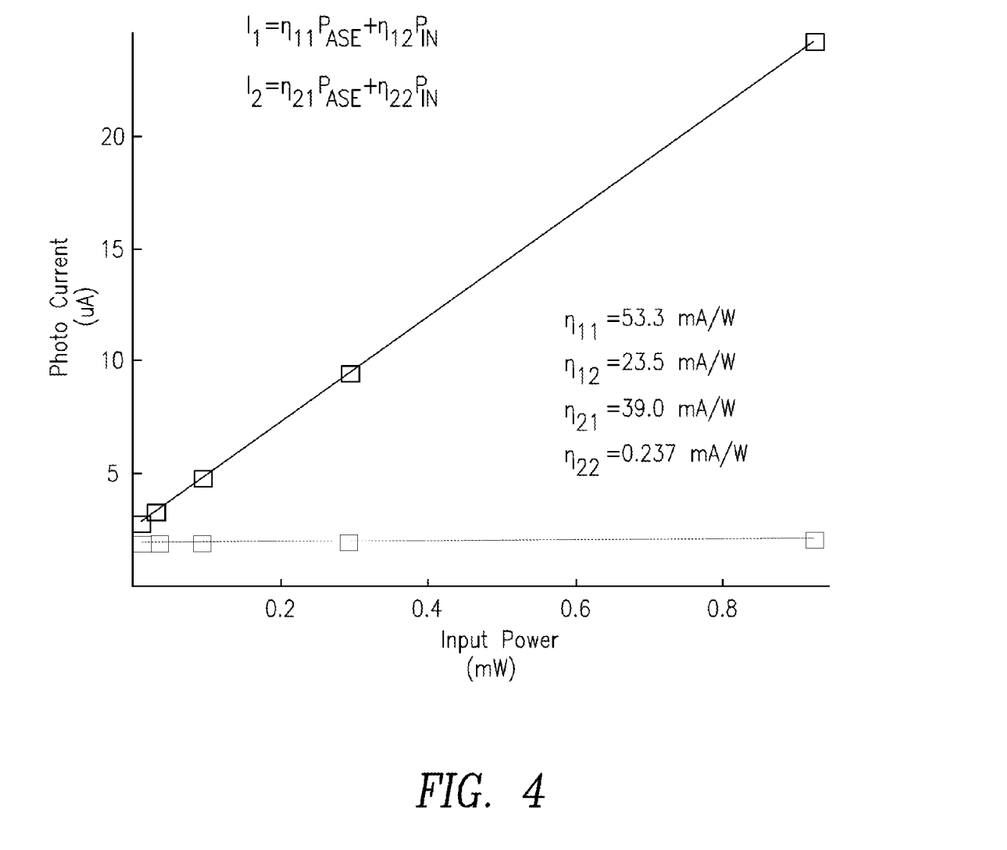
FIG. 4 is a graph of the sum of the output currents (in units of micro-amperes) of two strategically placed photodiodes in an optical circuit versus the input power (in units of miliwatts) to a SOA, in accordance with an embodiment of the present invention.

Here we briefly discuss the values of the optical power to current conversion responsivity coefficients for the two photodiodes shown in FIG. 4. The coefficients $\eta_{11}$ and $\eta_{21}$ are the responsivities for converting ASE optical power into a component of the current output for PD1 and PD2, respectively. As might be expected, from the view of FIG. 3, the magnitudes of and $\eta_{21}$ differ significantly but not greatly from one another, having values of 53.3 mA/W and 39 mA/W respectively. With reference to FIG. 3, the disparity in the magnitudes of $\eta_{11}$ and $\eta_{21}$ may be explained by the positioning of PD1 200 and PD2 300 with respect to SOA 100.

We now turn to the relative magnitudes of the responsivity coefficients $\eta_{12}$ and $\zeta_{22}$, which are the responsivities of PD1 200 and PD2 300 to power from reflected input signal 210. In the embodiment of FIG. 4, $\eta_{12}$ and $\eta_{22}$ have values of 23.5 mA/W and 0.237 ma/W, respectively. The large ratio between these two responsivity coefficients may also be explained by the relative positioning of PD1 200 and PD2 300 in the view of FIG. 3. However, in this case, the decline in concentration of power between PD1 200 and PD2 300 is much greater for optical power arising from reflected input signal 210 than for optical power from ASE energy, which was discussed above. This may arise from optical power generated by reflected input signal 210 being more concentrated than the ASE optical power.

FIG. 5 is a block diagram 500 of the interface of an optical circuit to a processor 510 in accordance with an embodiment of the present invention. FIG. 5 shows PD1 200 and PD2 300 connected to respective analog-to-digital converters (A/D converters) 502 and 504. A/D converters 502, 504 are in turn coupled to processor 510. Processor 510 in FIG. 5 may correspond to the general purpose computer system 600 described in detail in connection with FIG. 6. However, alternatively, processor 510 could be any device capable of processing digital data from A/D converters 502 and 502 including but not limited to: an application specific integrated circuit, a math co-processor; or any other digital data processing device.

PD1 200 may be a photodiode operable to general a direct-current (DC) electrical current indicative of the magnitude of optical power detected at an optical detection portion of PD1 200. However, numerous variations of this arrangement may be practiced while remaining within the scope of the present invention. PD1 200 may be configured to output a voltage, or other electrical quantity, instead of current, that is indicative of detected optical power. Moreover, PD1 200 could be configured to output AC (alternating current) current, or AC voltage instead of the corresponding DC versions of these quantities discussed earlier. In still other alternative embodiments, non-electrical quantities could be output from PD1 200, or other sensory device, to represent the magnitude of optical power present at a detection portion of PD1 200. The above possible variations of PD1 200 may apply equally to PD2 300 and/or to still further photodiodes, or other sensory devices, that could be deployed within the systems discussed herein.

Various embodiments of the present invention may provide the following features and advantages. In an embodiment, the use of residual reflected light from an optical device may be used to indirectly measure input power, in place of using power splitters which imposes power losses. In an embodiment, the use of stray light may be used to measure amplified spontaneous emission (ASE) power to monitor the health of the device.

Figure 6:
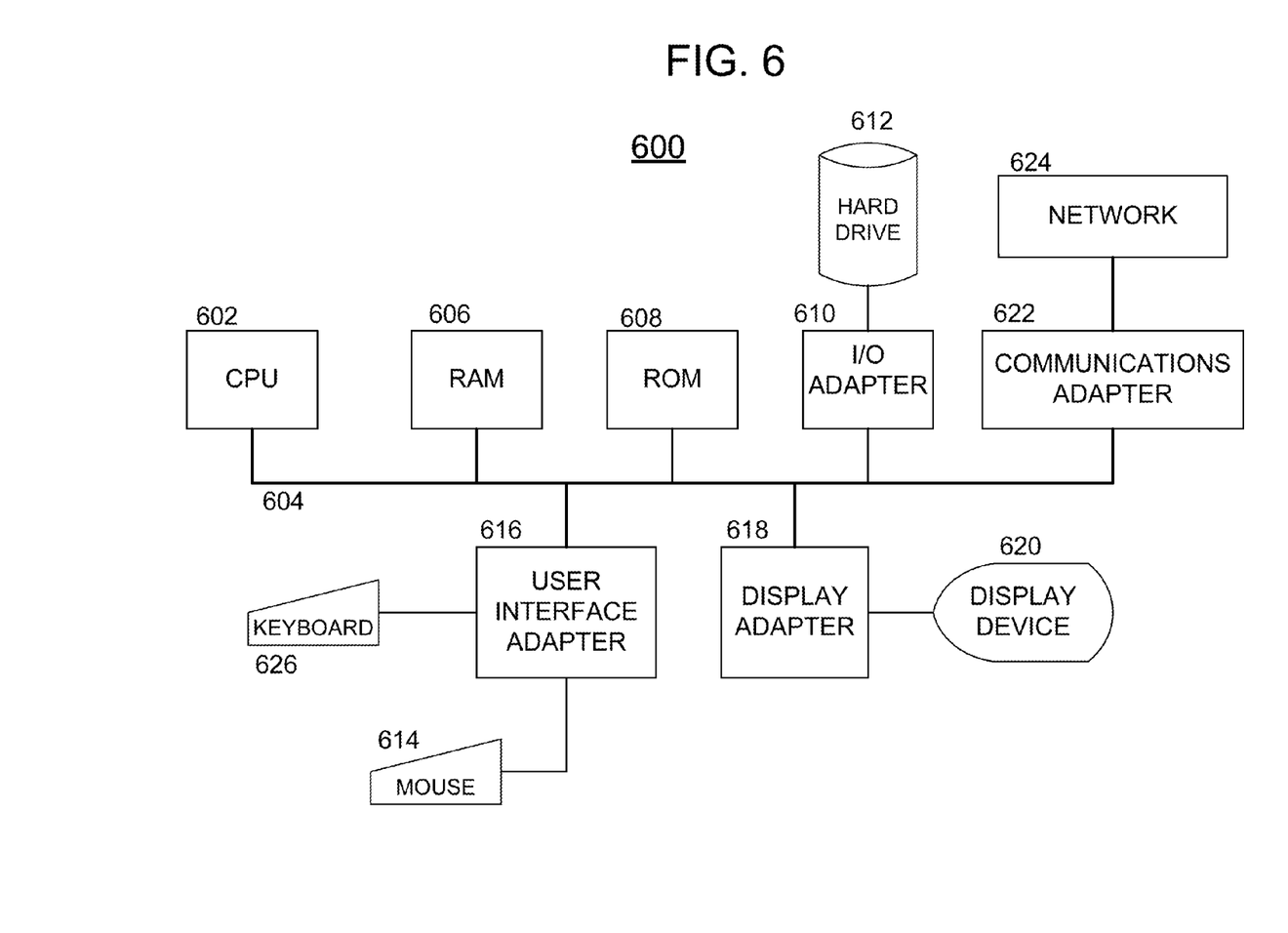
FIG. 6 is a block diagram of a computer system useable in conjunction with an embodiment of the present invention.

FIG. 6 is a block diagram of a computing system 600 adaptable for use with one or more embodiments of the present invention. For instance, computing system 600 may be employed as processor 510 of FIG. 5 to conduct calculations of responsivity coefficients using equation (1) and/or calculations of input signal 210 power and ASE power using equation (2).

In this embodiment, central processing unit (CPU) 602 may be coupled to bus 604. In addition, bus 604 may be coupled to random access memory (RAM) 606, read only memory (ROM) 608, input/output (I/O) adapter 610, communications adapter 622, user interface adapter 606, and display adapter 618.

In an embodiment, RAM 606 and/or ROM 608 may hold user data, system data, and/or programs. I/O adapter 610 may connect storage devices, such as hard drive 612, a CD-ROM (not shown), or other mass storage device to computing system 600. Communications adapter 622 may couple computing system 600 to a local, wide-area, or global network 624. User interface adapter 616 may couple user input devices, such as keyboard 626, scanner 628 and/or pointing device 614, to computing system 600. Moreover, display adapter 618 may be driven by CPU 602 to control the display on display device 620. CPU 602 may be any general purpose CPU.

It is noted that the methods and apparatus described thus far and/or described later in this document may be achieved utilizing any of the known technologies, such as standard digital circuitry, analog circuitry, any of the known processors that are operable to execute software and/or firmware programs, programmable digital devices or systems, programmable array logic devices, or any combination of the above. One or more embodiments of the invention may also be embodied in a software program for storage in a suitable storage medium and execution by a processing unit.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. An apparatus for monitoring optical equipment in an optical circuit, the apparatus comprising:
   an optical amplifier having an input for receiving an optical input signal and an output for outputting an amplified optical signal;
   a first photodiode located to receive residual reflected optical energy from the optical amplifier and ambient stray optical power from the optical amplifier;
   a second photodiode located substantially outside the reflection path of the optical input signal; and
   a processor for calculating a magnitude of a power level of the optical input signal from values of outputs from the first and second photodiodes.

2. The apparatus of claim 1, wherein the processor calculates a magnitude of the ambient optical power.

3. The apparatus of claim 1 wherein the optical amplifier is a semiconductor optical amplifier (SOA).

4. The apparatus of claim 1 wherein the ambient optical power includes amplified spontaneous emission (ASE) power from the optical amplifier.

5. The apparatus of claim 1 wherein the first and second photodiodes output electrical energy having magnitudes substantially proportional to optical power levels detected at the respective photodiodes.

6. The apparatus of claim 5 further comprising:
   analog-to-digital (A/D) converter for converting the electrical energy output of the first and second photodiodes into respective digital data values.

7. The apparatus of claim 6,
   wherein the processor is operable to calculate the power levels of the optical input signal and the ambient optical energy from the digital data values from the A/D conversion.

8. The apparatus of claim 7 wherein the processor is selected from the group consisting of: (a) a general purpose computer; (b) an application-specific integrated circuit (ASIC); and (c) a math-coprocessor.

9. The apparatus of claim 1 wherein the second photodiode is positioned to receive substantially only ambient optical power.

10. A method for monitoring a portion of an optical circuit, the method comprising:
    providing an optical circuit having an optical amplifier situated so as to receive an optical input signal and to residually reflect a portion of the energy of the received optical input signal, thereby providing a residual reflected input signal;
    placing a first photodiode along a path of the residual reflected optical input signal;
    placing a second photodiode substantially away from the path of the residual reflected optical input signal;
    detecting optical power levels at the first and second photodiodes arising from both the residual reflected optical input signal and from ambient stray optical power;
    generating outputs from the first and second photodiodes indicative of the power levels detected at the first and second photodiodes respectively; and
    calculating a magnitude of a power level of the optical input signal from the outputs from the first and second photodiodes.

11. The method of claim 10 further comprising:
    calculating a magnitude of the ambient optical power.

12. The method of claim 10 wherein the ambient optical power includes amplified spontaneous emission (ASE) power from the optical amplifier.

13. The method of claim 10 wherein the generating step comprises:
    generating electric current outputs from the first and second photodiodes indicative of the optical power levels detected at the first and second photodiodes, respectively.

14. The method of claim 13 further comprising:
    converting the electric current outputs from the first and second photodiodes into respective digital data values indicative of the optical power levels detected at the first and second photodiodes, respectively.

15. The method of claim 10 further comprising:
determining responsivity coefficients of the first and second photodiodes to power from the reflected input signal and to ambient optical power.

16. The method of claim 15 wherein the calculating step comprises:
determining the magnitude of the optical input signal power from the responsivity coefficients and the detected optical power levels at the first and second photodiodes.

17. The method of claim 15 further comprising:
distinguishing detected optical power arising from ambient optical power and detected optical power arising from the reflected input signal using the determined responsivity coefficients of the first and second photodiodes.

18. An apparatus for monitoring optical equipment in an optical circuit, the apparatus comprising:
a semiconductor optical amplifier (SOA) situated to receive an optical input signal and to reflect a portion of the energy of the received optical input signal, thereby providing a reflected input signal;
a first photodiode located along a path of the reflected input signal, and operable to detect optical power from the reflected optical input signal and from amplified spontaneous emission (ASE) power and to generate a first electric current indicative of the detected optical power;
a second photodiode located substantially outside the reflection path of the optical input signal and configured to receive and detect substantially only ASE power and to generate a second electric current indicative of the power level detected at the second photodiode; and
a processor for calculating magnitudes of the reflected optical input signal and of the ASE power using the first and second electric currents from the first and second photodiodes and responsivity coefficients of the first and second photodiodes.

19. An apparatus for monitoring optical equipment in an optical circuit, the apparatus comprising:
an optical device situated to receive an optical input signal and to reflect a portion of the energy of the received optical input signal, thereby providing a reflected input signal, wherein the optical device is a semiconductor optical amplifier (SOA);
a first photodiode located along a path of the reflected input signal, and operable to receive optical energy from the reflected optical input signal and from ambient optical power;
a second photodiode located substantially outside the reflection path of the optical input signal; and
a processor that calculates a magnitude of a power level of the optical input signal and an ambient optical power from values of outputs from the first and second photodiodes, wherein the ambient optical power includes amplified spontaneous emission (ASE) power from the optical device.

20. The apparatus of claim 19 wherein the second photodiode is positioned to receive substantially only the ASE power.

* * * * *